(12) United States Patent
Lee et al.

(10) Patent No.: US 8,570,048 B2
(45) Date of Patent: Oct. 29, 2013

(54) INSPECTION JIG FOR DISPLAY PANEL, INSPECTION SYSTEM USING THE SAME, AND METHOD FOR INSPECTING THE DISPLAY PANEL USING THE SAME

(75) Inventors: Sung-Kyu Lee, Suwon-si (KR); Sang-Rock Yoon, Seoul (KR); Ki-Seob Lee, Suwon-si (KR)

(73) Assignee: Samsung Display Co., Ltd. (KR)

( * ) Notice: Subject to any disclaimer, the term of this patent is extended or adjusted under 35 U.S.C. 154(b) by 664 days.

(21) Appl. No.: 12/416,462

(22) Filed: Apr. 1, 2009

(65) Prior Publication Data

US 2010/0033191 A1 Feb. 11, 2010

(30) Foreign Application Priority Data

Aug. 8, 2008 (KR) .................. 10-2008-0077707

(51) Int. Cl.
*H01H 31/02* (2006.01)

(52) U.S. Cl.
USPC ........ 324/555; 248/441.1; 248/447; 248/456; 248/457; 384/184; 702/150; 324/637; 324/770; 269/8

(58) Field of Classification Search
USPC .................. 324/555, 637, 770; 702/150–154; 384/184; 248/441.1, 447, 456, 457, 248/469, 473, 476, 477, 479, 488; 269/8
See application file for complete search history.

(56) References Cited

U.S. PATENT DOCUMENTS

| 2001/0052779 | A1* | 12/2001 | Okazaki ........................ 324/637 |
| 2004/0263202 | A1* | 12/2004 | Iwata et al. ................... 324/770 |
| 2006/0157904 | A1* | 7/2006 | Li et al. .............................. 269/8 |
| 2007/0120878 | A1* | 5/2007 | Hsiao et al. ................... 345/905 |
| 2007/0243826 | A1* | 10/2007 | Liu ............................. 455/67.11 |
| 2009/0114826 | A1* | 5/2009 | Takahashi et al. ........ 250/363.03 |
| 2009/0261219 | A1* | 10/2009 | Chen .......................... 248/206.2 |

FOREIGN PATENT DOCUMENTS

| JP | 2007040894 A | 2/2007 |
| KR | 19990034686 A | 5/1999 |
| KR | 1020070117051 A | 12/2007 |

* cited by examiner

*Primary Examiner* — Arleen M Vazquez
*Assistant Examiner* — Son Le
(74) *Attorney, Agent, or Firm* — Cantor Colburn LLP (57) ABSTRACT

An inspection jig for a display panel, used in an inspection system for the display panel and in a method for inspecting the display panel, includes a plate, a ground plate and at least one side holder. The ground plate is disposed on the plate and receives the display panel. The at least one side holder is disposed at a side surface of the plate to control the angle of the plate.

24 Claims, 8 Drawing Sheets

INSPECTION JIG FOR DISPLAY PANEL, INSPECTION SYSTEM USING THE SAME, AND METHOD FOR INSPECTING THE DISPLAY PANEL USING THE SAME

This application claims priority to Korean Patent Application No. 2008-77707, filed on Aug. 8, 2008, and all the benefits accruing therefrom under 35 U.S.C. §119, the contents of which are herein incorporated by reference in their entirety.

BACKGROUND OF THE INVENTION

1. Field of the Invention

The present invention relates to an inspection jig for a display panel, an inspection system for the display panel, and a method for inspecting the display panel using the inspection jig.

2. Description of the Related Art

Display panels, such as liquid crystal display ("LCD") panels, plasma display panels ("PDP") and organic light-emitting diode ("OLED") panels, are being developed as the technology of computer monitors, laptop computers, televisions and so on is becoming more advanced.

In addition, computers, laptop computers, televisions and so on are increasingly becoming sensitive to electromagnetic interference ("EMI") due to increases in communication frequencies, the number of antennas and so on, as wireless network communication is becoming more advanced.

Accordingly, an inspection jig used for inspecting a display panel, EMI, a throughput and so on before finishing a manufacturing process, is necessary. For example, the inspection jig may also be used for inspecting the EMI of a wireless local area network ("WLAN"), the EMI of a wireless wide area network ("WWAN") and the throughput for evaluating a field of a wireless network system.

BRIEF SUMMARY OF THE INVENTION

Since an inspection jig used for inspecting a display panel, EMI, a throughput and so on before finishing a manufacturing process, is necessary, there may be technical difficulties in fixing the display panel using the inspection jig and in completing an inspection of the display panel. For example, the inspection jig for the display panel may only include a plate and a fixing member fixing the display panel to the plate. While the inspection jig may fix the display panel, the inspection jig may not control the angle of the plate, when inspecting the EMI of the WLAN and/or WWAN, and throughput. Thus, there is a problem in that the display panel may not be sufficiently fixed during the inspection of the display panel, such that the inspection may not be carried out properly or inspection results may be negatively affected.

In addition, the inspection jig may not include an element for grounding antennas which may be disposed at a side of the display panel and/or on a rear surface of the display panel, so that an additionally fixing means is required. The additional fixing means may include a gasket or an aluminum tape used between the inspection jig and the display panel. Thus, there is a problem in that the gasket or the aluminum tape may have to be attached in every inspection process, adding disadvantageous costs and/or time to the manufacturing process of the display panel.

An exemplary embodiment provides an inspection jig for a display panel configured for controlling the angle of the display panel in every inspection process, and includes a ground plate so that additional steps or materials for attaching an element for grounding may be advantageously omitted.

An exemplary embodiment provides an inspection system for the display panel having the inspection jig.

An exemplary embodiment provides a method for inspecting the display panel using the inspection jig.

In an exemplary embodiment inspection jig for the display panel, the inspection jig includes a plate, a ground plate and at least one side holder. The ground plate is disposed on the plate and receives the display panel. The at least one side holder is disposed at a side surface of the plate and controls the angle of the plate.

The plate may include a fixing element and the ground plate may be fixed to the fixing element.

The ground plate may further include a first ground screw electrically connected to a main antenna of an external driving unit. In addition, the ground plate may further include a second ground screw electrically connected to a sub-antenna of the external driving unit.

The inspection jig may further include at least one guide part preventing the display panel from deviating from the ground plate.

The ground plate and the side holder may be separable from the plate.

The side holder may include a tightening element to fix the controlled angle of the plate. In addition, the side holder may further include a protractor to measure an inclination angle of the plate with respect to a plane upon which the side holder directly contacts or is disposed upon, or the surface of the earth. The side holder may have substantially a triangular shape.

The inspection jig may further include a top holder having substantially a U-shape. The plate to which the ground plate is fixed may be inserted into an opening portion of the top holder so that an upper portion of the ground plate may be supported. The top holder may include a tightening element configured such that the ground plate separable from the plate.

The inspection jig may further include at least one bottom holder protruded from the plate to have an L-shape and supporting a lower portion of the ground plate.

The ground plate may include a bottom plate facing the display panel, and at least one supporting part extended from a side of the bottom plate to support side surfaces of the display panel. The ground plate may be smaller than the plate.

The plate and the side holder may include reinforced plastic.

In an exemplary embodiment of an inspection system for a display panel, the inspection system includes an inspection jig, a driving unit, an antenna and a main body. The inspection jig includes a plate. The ground plate is disposed on the plate and receives a display panel which irradiates electromagnetic waves. The at least one side holder is disposed at a side surface of the plate to control the angle of the plate. The driving unit drives the display panel to inspect the display panel. The antenna receives the electromagnetic waves which are irradiated by the inspected display panel. The main body outputs evaluation data of the inspected display panel based on the electromagnetic waves received from the antenna.

The antenna may be spaced apart from the display panel and may move along a direction substantially perpendicular to a plane upon which the side holder is disposed, or the surface of the earth.

The inspection system may further include a spectrum analyzer analyzing a spectrum of the electromagnetic waves received from the antenna.

The inspection system may further include a monitor displaying the evaluation data.

In an exemplary embodiment of a method for inspecting a display panel, the method includes receiving a display panel in a ground plate disposed on a plate of an inspection jig. The angle of the plate is controlled. The display panel is driven to perform inspection on the display panel. Evaluation data of the inspected display panel is outputted by receiving electromagnetic waves irradiated by the inspected display panel.

The evaluation data may be further displayed.

The evaluation data of the inspected display panel may be outputted by receiving the electromagnetic waves at a position where the highest electromagnetic waves are sensed, analyzing the spectrum of the received electromagnetic waves, and outputting the evaluation data of the inspected display panel based on the analyzed spectrum.

The position of an antenna may be further changed to a direction substantially perpendicular to a plane upon which the side holder is disposed, or the surface of the earth, to find a position where the highest (e.g., largest in strength or quantity) electromagnetic waves are sensed.

The angle of the plate may be controlled by changing the angle of the plate to about 90° with respect to a plane upon which the side holder is disposed, or the surface of the earth during an electromagnetic interference (EMI) inspection.

The angle of the plate may be controlled by changing the angle of the plate to about 110° with respect to a plane upon which the side holder is disposed, or the surface of the earth during a wireless network characteristic inspection.

In an exemplary embodiment, the angle of a plate may be controlled by a side holder, so that a display panel may be controlled to have a predetermined angle in every inspection process of the display panel.

In an exemplary embodiment, a ground plate may be removably disposed between the plate and the display panel so that additional steps or materials for attaching an element for grounding may be unnecessary.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "upper" relative to other elements or features would then be oriented "lower" relative to the other elements or features. Thus, the term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to nonimplanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be explained in detail with reference to the accompanying drawings.

Figure 1:
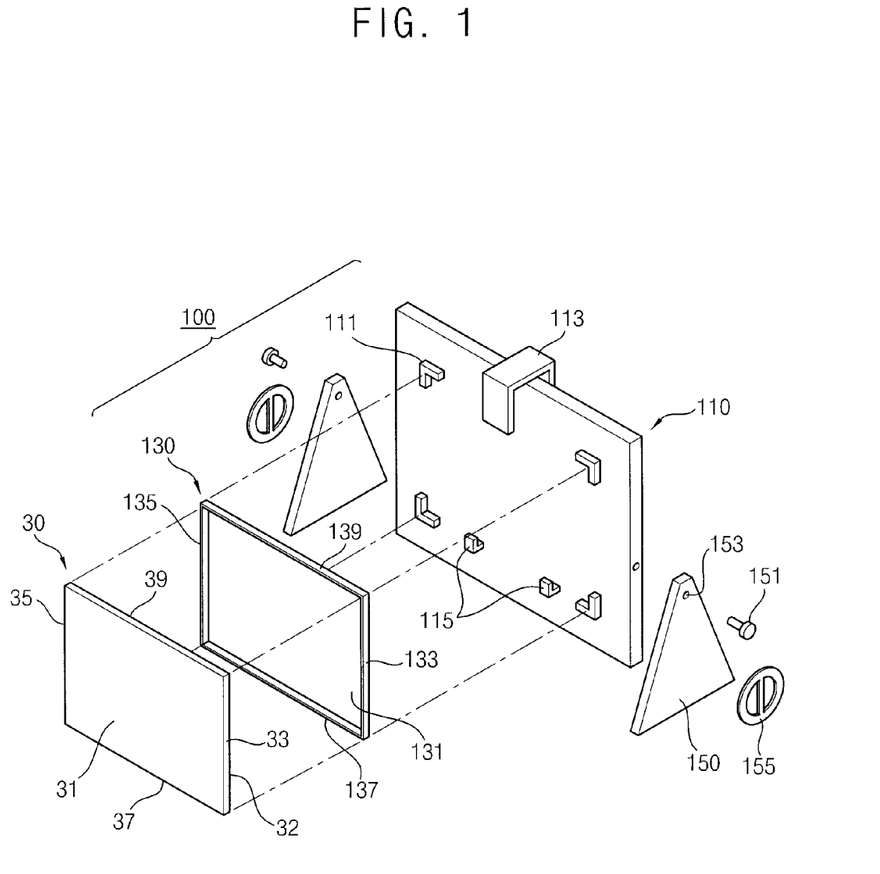
FIG. 1 is an exploded perspective view illustrating an exemplary embodiment of an inspection jig for a display panel according to the present invention.
Figure 2:
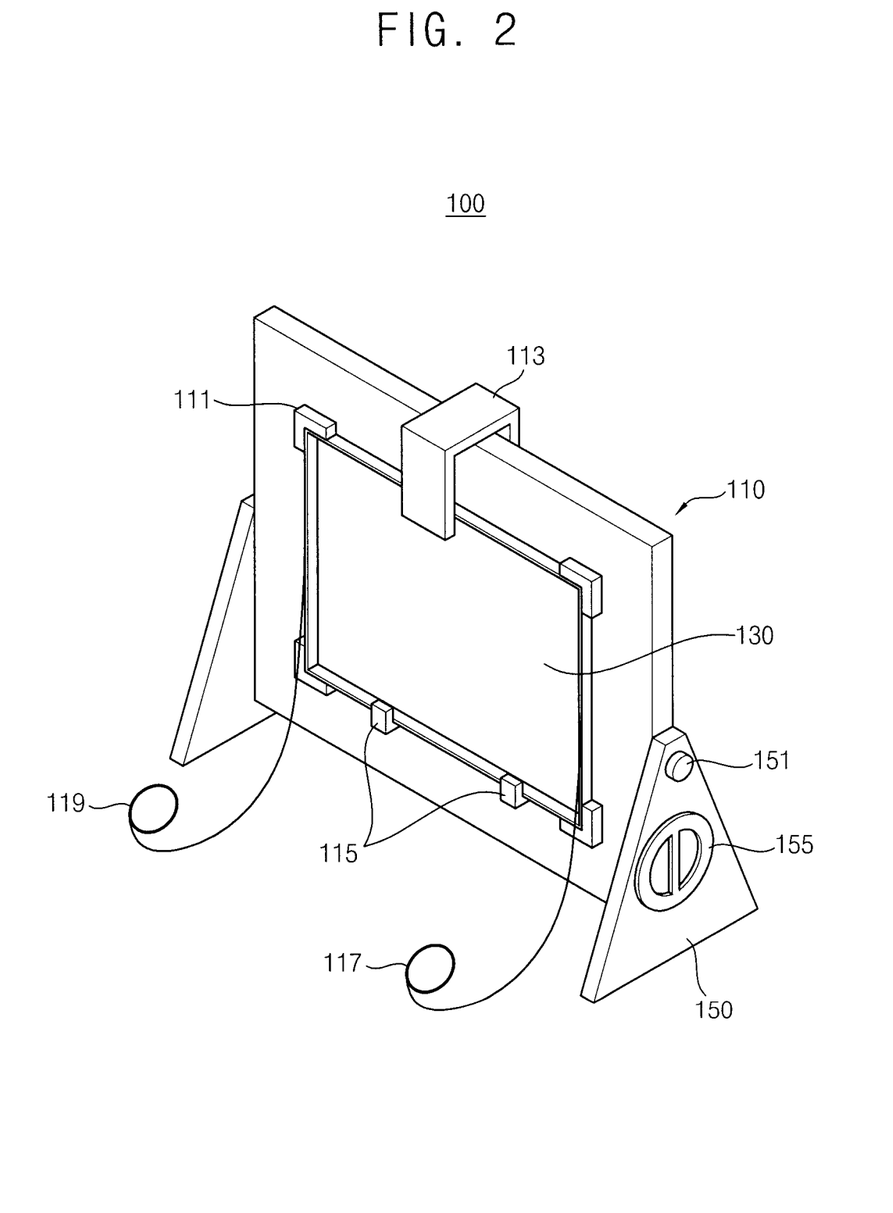
FIG. 2 is a front perspective view illustrating a completely assembled inspection jig of FIG. 1.
Figure 3:
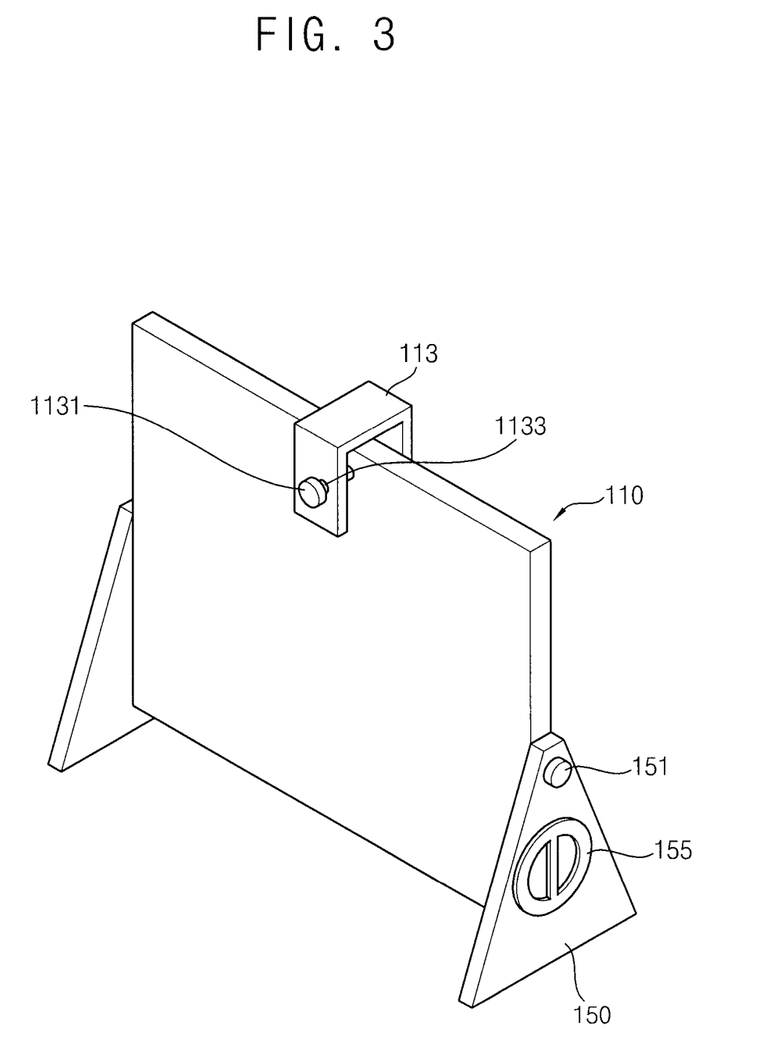
FIG. 3 is a rear perspective view illustrating the completely assembled inspection jig of FIG. 1.

FIG. 1 is an exploded perspective view illustrating an exemplary embodiment of an inspection jig for a display panel according to the present invention. FIG. 2 is a front perspective view illustrating a completely assembled inspection jig of FIG. 1. FIG. 3 is a rear perspective view illustrating the completely assembled inspection jig of FIG. 1.

Referring to FIGS. 1, 2 and 3, the inspection jig 100 for the display panel includes a plate 110, a ground plate 130 and a side holder 150.

The plate 110, the ground plate 130 and the side holder 150 are removably and detachably disposed with each other, such that the plate 110, the ground plate 130 and the side holder 150 are separable (e.g., configured to be separated) from each other. Alternatively, the plate 110, the ground plate 130 and/or the side holder 150 may be disposed as a single and continuous unit, such that the plate 110, the ground plate 130 and/or the side holder 150 are not separable from each other.

The plate 110 has a substantially rectangular shape. The plate 110 may be a substantially planar member, having a first planar surface and a second planar surface substantially parallel and facing each other, and side surfaces connecting the first and second surfaces. Alternatively, the plate 110 may have a substantially circular shape, a triangular shape, a polygonal shape and so on according to the shape of the display panel and/or the shape of the ground plate. The plate 110 may include an insulating material such that the plate 110 is configured not to affect electromagnetic waves. In one exemplary embodiment, the plate 110 may include rubber and/or reinforced plastic.

The inspection jig 100 may further include a fixing element 111 configured to maintain a position of the ground plate 130 relative to the plate 110. The fixing element 111 directly contacts a planar surface of the plate 110, and protrudes from the planar surface by a predetermined distance in a protrusion direction taken substantially perpendicular to the planar surface of the plate 110. The protrusion distance of the fixing element 111 may be substantially the same as a thickness of the ground plate 130 taken substantially parallel to the protrusion direction of the fixing element 111, but the invention is not limited thereto. The protrusion distance of the fixing element 111 may be more or less than the thickness of the ground plate 130, so long as the ground plate 130 can be supported and held by the fixing element 111.

As illustrated in FIGS. 1 and 2, the fixing element 111 may have a substantial L-shape, and be disposed proximate to edges of the plate 110. In one exemplary embodiment, a plurality of the fixing element 111 (e.g., four) may be disposed at a periphery of the plate 110, such as corresponding in position to corners of the plate 110. Alternatively, the fixing element 111 may have any of a number of various shapes according the shape of the ground plate 130, such that the position of the ground plate 130 is sufficiently maintained relative to the plate 110.

The inspection jig 100 may further include a top holder 113 fixing the ground plate 130 at an upper portion of the plate 110. The top holder 113 may overlap an entire of a transverse length of a longitudinal side surface, and portions of the first and second planar surfaces of the plate 110 directly adjacent to the longitudinal side surface, as illustrated in FIGS. 1-3.

The top holder 113 may be substantially U-shaped. A first portion of the top holder 113 overlaps the transverse length of the longitudinal side surface. A second portion of the top holder 113 is extended from a first end of the first portion, and forms a first inclined angle with the first portion. A third portion of the top holder 113 is extended from a second end of the first portion opposing the first end, and forms a second inclined angle with the first portion.

In an exemplary embodiment, the second and third portions may be disposed substantially perpendicular with the first portion, and may be disposed substantially parallel with each other. Inner surfaces of the first, second and third portions of the top holder 113 are disposed facing outer surfaces of the longitudinal side surface, the first planar surface and the second planar surface of the plate 110, respectively. The first, second and third portions of the top holder 113 may be a continuous and single member, such that the first, second and third portions are not separable from each other. Alternatively, the first, second and/or third portions may be configured so as to be separable from each other.

The top holder 113 may be removably and detachably disposed with the plate 110 of the inspection jig 100, such that the top holder 113 is separable (e.g., configured to be separated) from the plate 110. As illustrated in FIGS. 1 and 2, the plate 110 and the ground plate 130 may be inserted into an opening of the top holder 113 defined by the first, second and third portions of the top holder 113.

The top holder 113 may include a first fixing (e.g., tightening) element which is configured to removably attach the top holder 113 to the plate 110, and to makes the plate 110 separable from the ground plate 130 allowing the top holder 113 to be released from the plate 110. Referring to FIG. 3, the tightening element may include an opening 1133 and a fixing member (e.g., screw) 1131. The fixing member 1131 may be disposed at the second portion of the top holder 113, such as extending completely through the opening 1133 in the top holder 113. With the ground plate 130 inserted into the opening of the top holder 113 defined by the first, second and third portions of the top holder 113, the fixing member 1131 may be moved or controlled such that both a distal end of the fixing member 1131 and a surface of the ground plate 130 directly contact the first and second planar surfaces of the plate 110, respectively. The top holder 113 may include the insulating material of the plate 110, such as not to affect the electromagnetic waves. In one exemplary embodiment, the top holder 113 may include the rubber or the reinforced plastic as described above relative to the plate 110.

The inspection jig 100 may further include a bottom holder 115 fixing the ground plate 130 at a lower portion of the plate 110. The bottom holder 115 directly contacts the planar surface of the plate 110 which the fixing element 111 contacts, and protrudes from the planar surface by a predetermined distance in a protrusion direction taken substantially perpendicular to the planar surface of the plate 110. The bottom holder 115 includes a first portion contacting the planar surface and extended substantially perpendicular to the planar surface, and a second portion extended from a distal end of the first portion at an inclined angle to the first portion. A protrusion distance of the first portion of the bottom holder 115 may be substantially the same as a thickness of the ground plate 130 taken substantially parallel to the protrusion direction of bottom holder 115, but the invention is not limited thereto. The protrusion distance of the first portion of the bottom holder 115 may be more or less than the thickness of the ground plate 130, so long as the ground plate 130 can be supported and held by bottom holder 115.

The bottom holder 115 may have an L-shape, and may be integrally formed with the plate 110. The bottom holder 115 may be protruded from the lower portion of the plate 110. In one exemplary embodiment, the bottom holder 115 may include a plurality of the bottom holder 115, supporting a lower portion of the ground plate 130. In the illustrated embodiment in FIGS. 1 and 2 two of the bottom holder 115 are disposed at a periphery of the plate 110, such as being linearly aligned with a plurality of the fixing elements 111.

Inner surfaces of each of the plurality of the fixing elements 111 and the bottom holders 115 arranged at the lower portion of the plate 110 directly contact outer surfaces of the ground plate 130 at a common (lower) side or edge thereof, and restrict movement of a display panel 130 in each of orthogonal directions including a downward direction towards the bottom holder 115, in a sideward direction towards the side holders 150 and in a direction substantially perpendicular to and away from the plate 110. Inner surfaces of the fixing elements 111 arranged at the upper portion of the plate 110 directly contact outer surfaces of the ground plate 130 at a common (upper) side thereof, and restrict movement of the display panel in an upward direction towards the upper fixing elements 111 and the sideward direction. Alternatively, the bottom holder 115 may have any of a number of various shapes according the shape of the ground plate 130, such that the position of the ground plate 130 is sufficiently maintained relative to the plate 110.

The bottom holder 115 may include the insulating material of the plate 110 and/or the top holder, such as not to affect the electromagnetic waves. In one exemplary embodiment, the bottom holder 115 may include the rubber or the reinforced plastic as described above relative to the plate 110 and the top holder 113.

The ground plate 130 receives a display panel to be inspected, and exposes only a surface of the display panel through which images may be displayed. The ground plate 130 is substantially tray shaped, but alternatively, the ground plate 130 may have various kinds of shapes suitable for receiving the display panel. The position of the ground plate 130 is fixed by the fixing element 111 disposed on the plate 110, so that the size of the ground plate 130 is smaller than that of the plate 110.

The ground plate 130 includes a bottom plate 131 facing a display panel 30, and supporting parts 133, 135, 137 and 139 respectively extended from sides of the bottom plate 131, and configured to support side surfaces of the display panel 30. The bottom plate 131 may overlap an entire of a planar surface of the display panel 30 adjacent to the side surfaces of the display panel 30. The supporting parts 133, 135, 137 and 139 form a frame shape disposed at edges of the bottom plate 131. A metal plate disposed at the side surfaces of the display panel 30 is grounded by the supporting parts 133, 135, 137 and 139 of the ground plate 130. The supporting parts 133, 135, 137 and 139 may be continuously formed, or alternatively may be partially formed. As illustrated in FIGS. 1 and 2, each of the supporting parts 133, 135, 137 and 139 is extended along an entire length of the edges of the bottom plate 131. In an exemplary embodiment, the bottom plate 131 and the supporting parts 133, 135, 137 and 139 may form a continuous and indivisible member, or the bottom plate 131 and the supporting parts 133, 135, 137 and/or 139 may be separable from each other.

In addition, the ground plate 130 may further include first and second ground lines 117 and 119. Since the first and the second ground lines 117 and 119 may be directly attached to the ground plate 130, the first and the second ground lines 117 and 119 are removably attached from the plate 110 when the ground plate 130 is detached from the plate 110. The first ground line 117 may be connected to a main antenna of an external driving unit (not shown), and the second ground line 119 may be connected to a sub-antenna of the external driving unit. In one exemplary embodiment, the external driving unit may be a main body of a laptop computer driving the display panel 30.

In exemplary embodiments, the first and second ground lines 117 and 119 may be a screw type. The first and second ground lines 117 and 119 are connected to a coated portion of the antenna of the external driving unit. Thus, the main and sub-antennas of the external driving unit are electrically connected to the first and second ground lines 117 and 119, to be grounded.

In an exemplary embodiment, the display panel 30 to be inspected may be a liquid crystal display ("LCD") panel, a plasma display panel ("PDP"), an organic light-emitting diode ("OLED") panel and so on. The display panel 30 is driven by the external driving unit. The display panel 30 may be connected to the external driving unit through a wired or a wireless network.

Referring to FIG. 1, the display panel 30 is received by the ground plate 130, and only a front surface 31 of the display panel 30, through which the images are displayed, is exposed. When the display panel 30 is received by the ground plate 130, a rear surface 32, which is opposite to the front surface 31 with respect to the display panel 30, faces the bottom plate 131 of the ground plate 130. The bottom plate 131 of the ground plate 130 may overlap a whole of the planar rear (e.g., non-display) surface 32. Side surfaces 33, 35, 37 and 39 of the display panel 30 respectively face the supporting parts 133, 135, 137 and 139 of the ground plate 130, and are received by the ground plate 130. An entire of the display panel 30 is accommodated between the bottom plate 131 and the supporting parts 133, 135, 137 and 139 of the ground plate 130. The display panel 30 and the ground plate 130 have the substantially rectangular shape, but alternatively may have various kinds of shapes such as the circular shape, the triangular shape, the polygonal shape and so on. A shape and dimension of a receiving space defined by the bottom plate 131 and the supporting parts 133, 135, 137 and 139 of the ground plate 130 may be substantially similar to a shape and dimension of the display panel 30.

The ground plate 130 receiving the display panel 30 is fixed by the fixing element 111 disposed on the plate 110. The ground plate 130 fixed by the fixing element 111 at an upper side thereof, may be supported at a lower side thereof by the bottom holder 115 disposed at the lower portion of the plate 110. In addition, the ground plate 130, receiving the display panel 30, is fixed to the plate 110 and is inserted into a U-shape opening of the top holder 113, which is disposed at the upper portion of the plate 110. The distal end of the top holder 113 overlaps edge portions of both the ground plate 130 and the display panel 30, as illustrated in FIG. 2. As described above, the ground plate 130 may be fixed at the upper portion of the plate 110 by the tightening element of the top holder 113.

Advantageously, the inspection jig 100 including the ground plate 130, the fixing element 111, the top holder 113 and the bottom holder 115 receives, supports and restricts movement of the display panel 30 in each of orthogonal directions, as described above. Thus, deviation of the display panel 30 from the inspection jig 100 may be reduced or effectively prevented, even though an angle of the plate 110 with respect to a surface of the earth, or a supporting surface of the inspection jig 100, is less than about 90°. The supporting surface of the inspection jig 100 may also be considered as a planar surface upon which the inspection jig 100 is disposed, such as a plane contacting a base of the side holder 150.

Referring again to FIGS. 1-3, the side holder 150 supports the plate 110 at both of opposing side surfaces of the inspection jig 100 for the display panel 30, such that the inspection jig 100 may be considered as including a plurality of the side holder 150. The side holder 150 is configured to change, maintain and control the angle of the plate 110 with respect to the surface of the earth or the supporting surface upon which the inspection jig 100 is positioned. In the illustrated embodiment, the side holder 150 has a substantially triangular shape, but alternatively the side holder 150 may have a rectangular shape and so on. Each of the plurality of the side holder 150 is disposed at each of both opposing side surfaces of the plate 110. The side holders 150 may be separated from each other and not directly connected to each other, as illustrated in FIGS. 1-3. Alternatively, the plurality of the side holder 150 disposed at each of both opposing side surfaces of the plate 110 may be directly connected with each other.

In an exemplary embodiment, the side holder 150 may further include a protractor 155. The protractor 155 measures an inclination angle of the plate 110 with respect to the surface of the earth the supporting surface upon which the inspection jig 100 is positioned. The protractor 155 may be disposed at only one of the side holders 150 disposed at the both opposing side surfaces of the plate 110, or may be disposed at both side holders 150.

The side holder 150 may further include a second fixing (e.g., tightening element). The second tightening element is configured such that the side holder 150 is separable from the plate 110. In addition, a selected angle of the plate 110 with respect to the surface of the ground may be maintained and controlled by the second tightening element. In one exemplary embodiment, after selecting the angle of the plate 110 for use in every inspection process of the display panel 30, the second tightening element of the side holder 150 is actuated to fix and control the selected angle of the plate 110.

The second tightening element of the side holder 150 may include a fixing member (e.g., screw) 151 and an opening 153 formed completely through the side holder 150 to correspond to a dimension of the screw 151. An opening corresponding to a location and/or the dimension of the screw 151 of the side holder 150, may be disposed at the side surface of the plate 110, as illustrated in the exploded view of FIG. 1. The screw 151 engages with both the opening 153 formed in the side holder 150 and in the plate 110, such that the selected angle of the plate 110 is fixed, and movement of the plate 110 from the selected angle is restricted and effectively prevented. The plate 110 is pivotable about a pivot axis defined by the opening 153 and the screw 151.

The side holder 150 may include the insulating material of the plate 110, the top holder 113 and/or the bottom holder 115 as described above, such as not to affect electromagnetic waves. In one exemplary embodiment, the side holder 150 may include the rubber or the reinforced plastic as discussed above with respect to the plate 110, the top holder 113 and/or the bottom holder 115.

In an exemplary embodiment, the side holder 150 may further include an automatic angle controller (not shown) automatically controlling the angle of the plate 110, such as using a non-manual adjustment means.

Advantageously, the inspection jig 100 including the side holder 150 described above, further maintains a position and restricts movement of the display panel 30 during inspection processes, even though an angle of the plate 110 with respect to a surface of the earth, or a supporting surface of the inspection jig 100, is less than about 90°.

Figure 4:
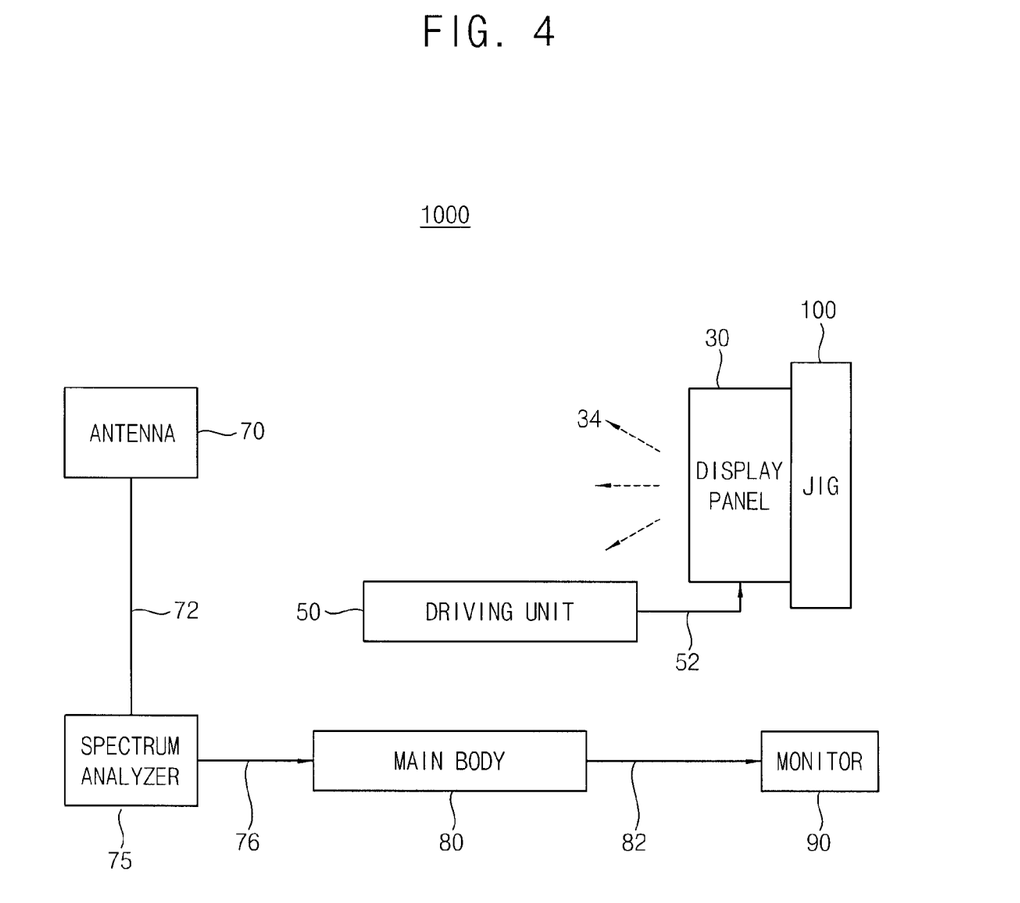
FIG. 4 is a block diagram illustrating an exemplary embodiment of an inspection system for the display panel according to the present invention.

FIG. 4 is a block diagram illustrating an exemplary embodiment of an inspection system for a display panel according to the present invention.

Referring to FIGS. 1 to 4, the inspection system 1000 for a display panel includes an inspection jig 100, a driving unit 50, an antenna 70 and a main body 80. The antenna 70 represents the main antenna and/or the sub-antenna. The inspection system 1000 may further include a spectrum analyzer 75. In addition, the display inspection system 1000 may further include a monitor 90.

The inspection jig 100 is substantially the same as mentioned above referring to FIGS. 1 to 3, and thus any further repetitive explanation concerning the inspection jig 100 will be omitted. The ground plate 130 of the inspection jig 100 receives a display panel 30 to be inspected.

The angle of the plate 110 with respect to the surface of the earth may be controlled to be a predetermined angle by the side holder 150 to be used in every inspection process of the display panel 30. When controlling the predetermined angle of the display panel 30 with respect to the surface of the earth in every inspection process, the angle of the plate 110 on which the ground plate 130 receiving the display panel 30 is disposed is controlled and maintained by the inspection jig 100. In one exemplary embodiment, the controlled angle of the plate 110 is fixed by the second tightening element of the side holder 150, so that the inspection process may be consistently and safely performed.

A display panel 30, which may be a device to be inspected, is received by the ground plate 130 and is disposed on the plate 110 of the inspection jig 100. The display panel 30 is driven by the driving unit 50. The driving unit 50 provides a driving signal 52 to the display panel 30, to drive the display panel 30.

When the display panel 30 is driven during inspection, the display panel 30 displays images and irradiates electromagnetic waves 34. In one exemplary embodiment, the display panel 30 to be inspected may be an LCD monitor of a laptop computer, and the driving unit 50 may be a main body of the laptop computer.

The antenna 70 receives the electromagnetic waves 34 irradiated from the display panel 30. The antenna 70 may be spaced apart from the display panel 30, and may move along a direction substantially perpendicular to the surface of the earth. In one exemplary embodiment, the antenna 70 may be spaced apart from the display panel 30 by about 10 meters (m), and may be configured to move along the direction substantially perpendicular to the surface of the earth, within a distance between about 1 meter (m) and about 4 meters (m). The antenna 70 provides a received electromagnetic wave 72 to the main body 80.

The main body 80 generates and outputs evaluation data 82 based on the electromagnetic waves 72 received from the antenna 70. The electromagnetic waves 72 received from the antenna 70 are essentially transformed into the evaluation data 82 by the main body 80. The evaluation data 82 is used in the inspection of the display panel. The main body 80 provides the evaluation data 82 to the monitor 90, as illustrated in FIG. 4.

The inspection system 1000 for the display panel 30 may further include the spectrum analyzer 75. The spectrum analyzer 75 analyzes a spectrum of the electromagnetic waves 72 received from the antenna 70, and outputs an analyzed spectrum 76. The spectrum of the electromagnetic waves 72 is essentially transformed into the analyzed spectrum 76 by the spectrum analyzer 75. The main body 80 reads the spectrum 76 analyzed by the spectrum analyzer 75 to output the evaluation data 82 described above.

The monitor 90 displays the evaluation data 82 outputted by the main body 80. The display panel 30 may be considered as being inspected based on the evaluation data 82. The display panel 30 may be inspected by monitoring the evaluation data 82 displayed on the monitor 90, or by performing subsequent operations on the evaluation data 82 to transform the evaluation data 82 into inspection results.

An electromagnetic interference ("EMI") inspection may be employed for inspecting an electromagnetic interference reaching relatively far away from the display panel 30. In one exemplary embodiment, a distance between the display panel 30 and the antenna 70 may be about 10 meters (m).

In the inspection of a display panel 30 relative to a wireless network, the EMI inspection of a wireless local area network ("WLAN"), the EMI inspection of a wireless wide area network ("WWAN") and a throughput inspection of a wireless network system, involve evaluating the electromagnetic interference near wireless network devices. A distance between the display panel 30 to be inspected and the antenna 70 may be within about 1 meter (m).

Figure 5:
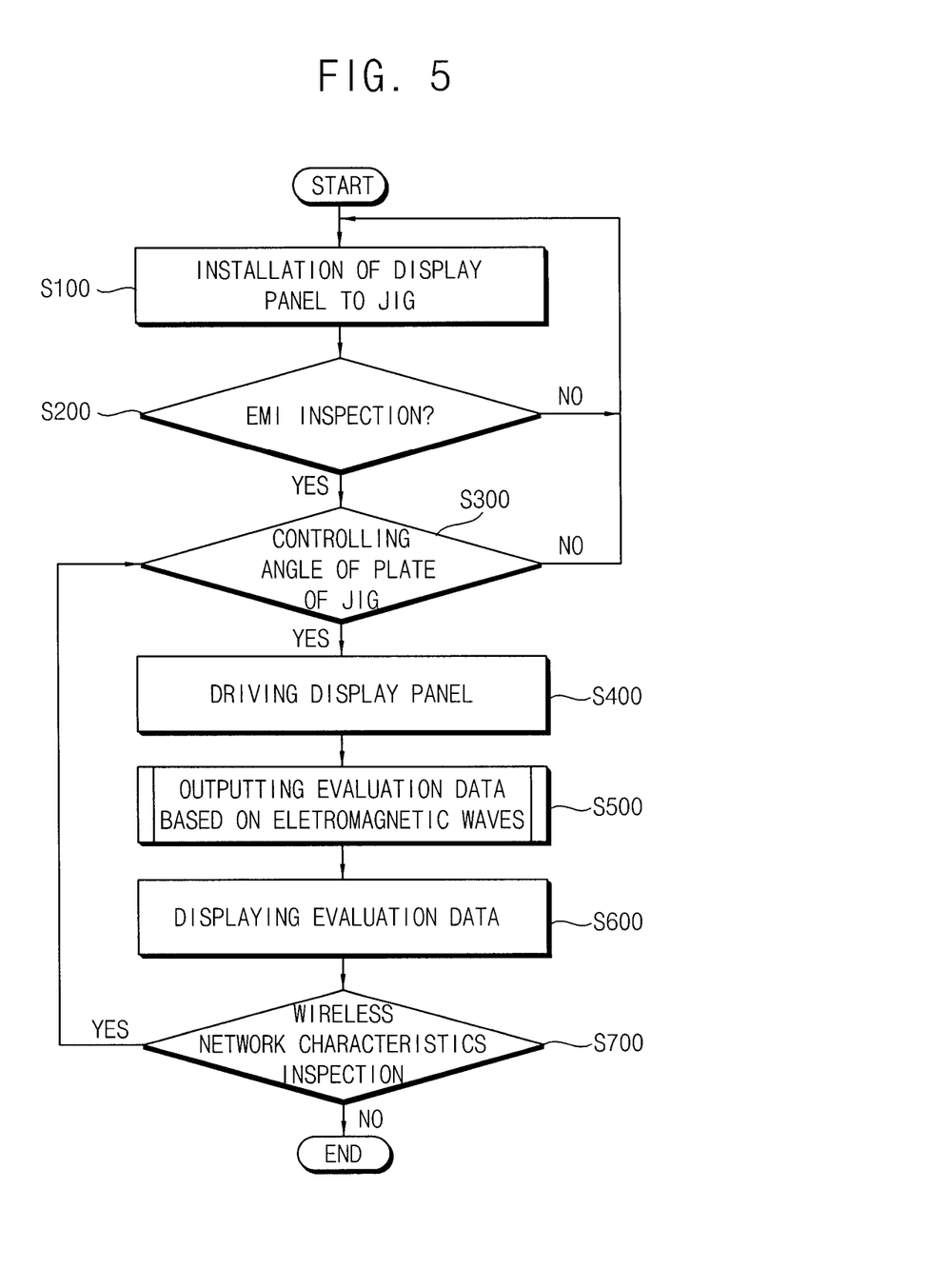
FIG. 5 is a flowchart showing an exemplary embodiment of a method for inspecting the display panel according to the present invention.

FIG. 5 is a flowchart showing an exemplary embodiment of a method for inspecting a display panel according to the present invention.

Referring to FIGS. 1 to 5, the method for inspecting the display panel 30 includes installing a display panel 30 to the inspection jig 100 (step S100).

To install the display panel 30 to the inspection jig 100, the display panel 30 may be received by the ground plate 130, the ground plate 130 may be fixed by the bottom holder 115 of the plate 110, the ground plate 130 and the plate 110 may be inserted into the top holder 113, and the tightening element of the top holder 113 may be actuated to fix and maintain a position of the display panel 30.

Whether the EMI inspection of the display panel 30 installed to the inspection jig 100 is necessary or not, is determined (step S200).

When the EMI inspection is not necessary, a process of the method returns to a start step. However, when the EMI inspection is necessary, an angle of the plate 110 of the inspection jig 100 is controlled (step S300). To fix the angle of the inspection jig 100, the angle of the plate 100 may be selected and the plate 110 moved to the selected angle. The tightening element of the side holder 150 may be actuated to fix and control the angle of the plate 110. In one exemplary embodiment, EMI noise is mostly generated when the angle of the display panel 30 with respect to the surface of the earth is about 90° during the EMI inspection, so that the desired angle of the plate 110 with respect to the surface of the earth may be controlled to be about 90°. Alternatively, the angle of the plate 110 with respect to the surface of the earth may be controlled by the automatic angle controller.

After the angle of the plate 110 is controlled, the driving unit 50 drives the display panel 30 (step S400). In one exemplary embodiment, the driving unit 50, which is the main body of the laptop computer, may drive the display panel 30. The display panel 30 undergoing inspection displays images and irradiates the electromagnetic 34 waves as a result of the driving by the driving unit 50.

The evaluation data 82 of the inspected display panel 30 is outputted based on the electromagnetic waves irradiated from the inspected display panel 30 (step S500).

Figure 6:
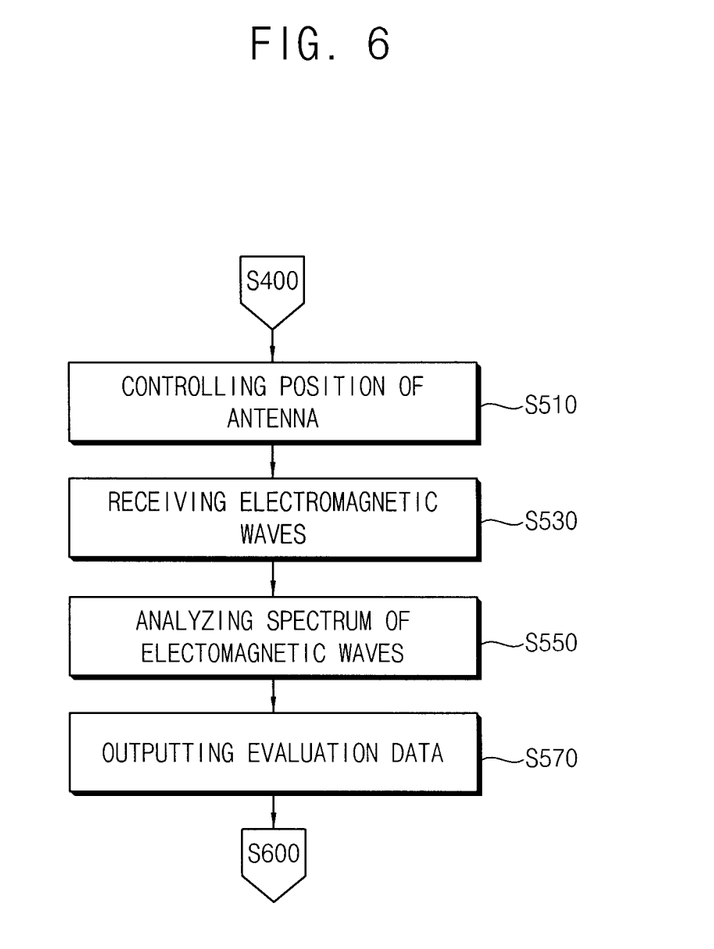
FIG. 6 is a flowchart showing an exemplary embodiment of a process for outputting evaluation data of the display panel based on electromagnetic waves.

FIG. 6 is a flowchart showing an exemplary embodiment of a process for outputting evaluation data of the display panel based on electromagnetic waves.

Referring to FIG. 6, the antenna 70 disposed spaced apart from the display panel 30 to be inspected, stops at a position where the highest electromagnetic waves irradiated from the display panel 30 being inspected is sensed. The position of the antenna 70 may be changed along the direction substantially perpendicular to the surface of the earth to find a position where the highest (e.g., largest in quantity and/or strength) electromagnetic waves are sensed (step S510).

After the position of the antenna 70 is determined, the electromagnetic waves 34 are received from the display panel 30 undergoing inspection (step S530). In one exemplary embodiment, the antenna 70 may be preset to sense the electromagnetic waves having a frequency between about 30 MHz and about 1 GHz. The antenna 70 outputs the received electromagnetic waves 72 to the spectrum analyzer 75. The spectrum analyzer 75 analyzes the spectrum of the electromagnetic waves (step S550).

The main body 80 outputs the evaluation data 82 of the inspected display panel from the spectrum 76 of the electromagnetic analyzed by the spectrum analyzer 75 (step S570).

Referring to FIG. 5 again, the evaluation data 82 outputted by the main body 80 is transferred to the monitor 90. The monitor 90 displays the received evaluation data (step S600). In an exemplary embodiment, the EMI noise of the inspected display panel 30 and so on may be evaluated by monitoring the monitor 90.

After the EMI inspection is finished, whether other inspections including a wireless network characteristic inspection such as the EMI inspection of the WLAN system, the EMI inspection of the WWAN system and the throughput inspection of the wireless network system and so on is necessary or not, is determined (step S700).

When the wireless network characteristic inspection may be unnecessary, the inspection is finished (END). When the wireless network characteristic inspection is necessary, the angle of the plate 110 of the inspection jig 100 is controlled again (step S300).

In one exemplary embodiment, the EMI noise may be mostly generated when the angle of the display panel 30 to be inspected with respect to the surface of the earth is about 110° in the EMI inspection of the WLAN system, the EMI inspection of the WWAN system and the throughput inspection of the wireless network system, so that the angle of the plate 110 with respect to the surface of the earth is controlled to be about 110°. In an exemplary embodiment, the angle of the plate 110 mentioned above may be automatically controlled by the automatic angle controller.

The wireless network characteristic inspection may follow substantially the same method as mentioned above, using S400 to S600. In one exemplary embodiment, the antenna may be preset to sense the electromagnetic waves having the frequency between about 2.4 GHz and about 5 GHz in the EMI inspection of the WLAN system. The antenna may be preset to sense the electromagnetic waves having the frequency in a range of about 800 MHz, 900 MHz, 1800 MHz, and 1900 MHz. The display panel inspection system 1000 may be disposed in a chamber or in a shield box. When the display panel 30 to be inspected is relatively far away from the antenna 70, the inspection is performed in the chamber. When the display panel 30 to be inspected is relatively close to the antenna 70, the inspection is performed in the shield box.

In the illustrated exemplary embodiments, the angle of a display panel to be inspected may be controlled to be a predetermined angle, and maintained for every inspection process. In addition, an inspection jig including side holders, a top holder and bottom holders support and maintain a selected position of a ground plate and the display panel received in the ground plate, so that the display panel may be consistently and safely inspected. In addition, the ground plate receiving the display panel is disposed between a plate and the display panel, and includes grounding lines, so that additional steps or materials used for attaching an element for grounding, in every inspection process may be advantageously omitted.

Figure 7:
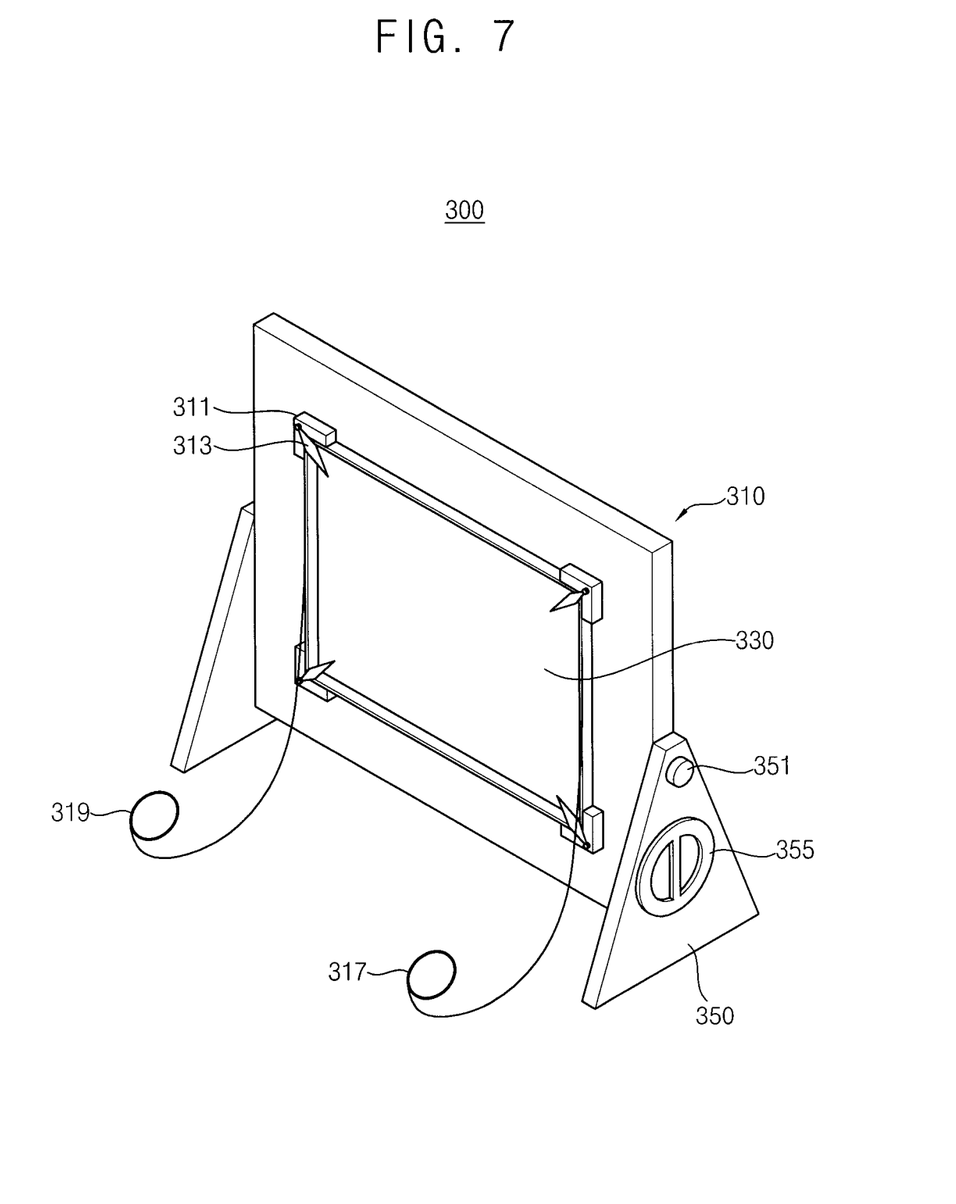
FIG. 7 is a perspective view illustrating another exemplary embodiment of an inspection jig for a display panel according to the present invention.

FIG. 7 is a perspective view illustrating another exemplary embodiment of an inspection jig for a display panel 30 according to the present invention.

Referring to FIG. 7, the inspection jig 300 for a display panel 30 includes a plate 310, a ground plate 330, a side holder 350 and a guide part 313. Any further repetitive explanation concerning FIGS. 1 to 3 will be omitted.

The plate 310, the ground plate 330, the side holder 350 and the guide part 313 are separable from each other. Advantageously, a display panel 30 to be inspected is removably disposed with the inspection jig 300, since the plate 310, the ground plate 330, the side holder 350 and the guide part 313 are separable from each other.

The plate 310 includes a fixing element 311 configured to maintain a position of the ground plate 330 relative to the plate 310. The fixing element 311 directly contacts a planar surface of the plate 310, and protrudes from the planar surface by a predetermined distance in a protrusion direction taken substantially perpendicular to the planar surface of the plate 110. Inner surfaces of the fixing element 311 directly contact outer surfaces of the ground plate 330, such as at corners of the ground plate 330.

The fixing element 311 may have a substantially L-shape, and may be disposed at edges of the plate 310, such as proximate to four corners of the plate 310. Alternatively, the fixing element 311 may have various kinds of shapes according the shape of the ground plate 330 or the display panel 30. The plate 310 may include an insulating material so as not to affect the electromagnetic waves. In one exemplary embodiment, the plate 310 may include rubber or reinforced plastic.

The guide part 313 guides the display panel 30, and with the fixing element 311, accommodates the display panel 30 therebetween. Corner edges of the display panel 30 and the ground plate 330 may be disposed in a receiving space defined by the guide part 313, the fixing element 311 and the plate 310, as illustrated in FIG. 7. The combination of the guide part 313, the fixing element 311 and the plate 310 restricts movement of the display panel 30 in each of orthogonal directions including a downward direction, an upward direction, a sideward direction and a direction away from the plate 310. Advantageously, deviation of the display panel 30 and the ground plate 330 from the plate 310, when the angle of the plate 310 with respect to the surface of the earth is no more than about 90°, is reduced or effectively prevented.

The ground plate 330 receiving the display panel 30 to be inspected, may be initially separated from the inspection jig 300, or may be pre-attached to the inspection jig 300 via moving the guide part 313 prior to inserting the display panel 30 into the ground plate 330. In the illustrated exemplary embodiment, the bottom holder 115 and the top holder 113 in the previous exemplary embodiment concerning FIGS. 1 to 3 are omitted, and are replaced by the guide part 313. Advantageously, the inspection jig 300 may be more easily assembled and used to hold the display panel 30 to be inspected, while reducing the number of additional elements for securing the display panel 30 in inspection processes.

In the illustrated exemplary embodiment, after inserting the display panel 30 into the ground plate 330, the combined ground plate 330 and display panel 30 may be accommodated and fixed to the plate 310, such as by moving the guide part 313 and inserting the ground plate 330 having the display panel 30. Alternatively, after initially attaching the ground plate 330 to the plate 310, the display panel 30 may be inserted into the ground plate 330 previously attached to the plate 310, such as by moving the guide part 313 and inserting the display panel 30 into the ground plate 330.

The guide part 313 may be disposed directly on the fixing element 311, but alternatively the guide part 313 may be disposed directly on the plate 310. The guide part 313 overlaps a portion of the corner edges of the ground plate 330, extends toward a center area of the ground plate 330, and overlaps a portion of a display surface of the display panel 30, as illustrated in FIG. 7. Each of inner surfaces of a plurality of the guide part 313 may disposed contacting the display surface of the display panel 30, such as to restrict movement away from the ground plate 330. The guide part 313 may be configured to be moved from an original position, such as to accommodate the ground plate 330 and/or the display panel 30, and once the ground plate 330 and/or the display panel 30 are inserted, to return to the original position restricting movement of the inserted ground plate 330 and/or the display panel 30.

The ground plate 330 receives the display panel 30 to be inspected, and exposes only a surface of the inspected display panel 30 through which images are displayed. The ground plate 330 has a substantially tray shape, but alternatively the ground plate 330 may have various kinds of shapes, such as corresponding to the shape of the display panel 30. The position of the ground plate 330 is fixed by the fixing element 311 disposed on the plate 310, so that the size of the ground plate 330 is smaller than that of the plate 310.

In addition, the ground plate 330 may further include first and second ground lines 317 and 319. The first ground line 317 may be connected to the main antenna of an external driving unit (not shown), and the second ground line 319 may be connected to the sub-antenna of the external driving unit. In one exemplary embodiment, the external driving unit may be the main body driving the display panel 30 to be inspected.

The first and second ground lines 317 and 319 may be a screw type, and may be connected to a coated portion of the antenna of the external driving unit. The main and sub-antennas of the external driving unit are electrically connected to the first and second ground lines 317 and 319, to be grounded.

In exemplary embodiments, the display panel 30 to be inspected may include an LCD panel, a PDP, an OLED panel and so on. The display panel 30 is driven by the external driving unit. The display panel 30 may be connected to the external driving unit through a wired or a wireless network.

A position of the ground plate 330 receiving the display panel 30 is maintained by the fixing element 311 disposed on the plate 310, such that deviation of the ground plate 330 away from the plate 310 may be reduced or effectively prevented. In addition, deviation of the ground plate 330 receiving the display panel 30, may be reduced or effectively prevented by the guide part 313 contacting and restricting movement in upward, downward and side directions.

The side holder 350 support the plate 310 at both of opposing side surfaces of the inspection jig 300 for the display panel 30, and set, maintain and control the angle of the plate 310. The side holder 350 has a substantially triangular shape, but alternatively may have the rectangular shape and so on.

The side holder 350 may further include a protractor 355. The protractor 355 indicates an inclination angle of the plate 310 with respect to the surface of the earth or a supporting surface upon which the inspection jig 300 is placed. The protractor 355 may be disposed at only one of the side holders 350, or may be disposed at both of a plurality of the side holders 150.

The side holder 350 may further include a tightening element, or securing element. The tightening element is configured such that the side holder 350 is separable from the plate 310. In addition, the angle of the plate 310 with respect to the surface of the ground may be maintained by the tightening element. In one exemplary embodiment, after setting the angle of the plate 310 to be used every inspection process, the tightening element of the side holder 350 is actuated to fix the angle of the plate 310 during the inspection processes.

The tightening element of the side holder 350 may include a fixing member (e.g., screw) 351 and an opening formed completely through the side holder 350 to correspond to a dimension of the screw 351. An opening corresponding to a location and/or the dimension of the screw 351 of the side holder 350, may be formed at the side surface of the plate 310. The screw 351 engages with both the opening formed in the side holder 350 and in the plate 310, such that the selected angle of the plate 310 is fixed, and movement of the plate 310 from the selected angle is restricted and effectively prevented. Actuating of the tightening element of the side holder 350 may also release the plate 310 from a fixed position, such that the angle of the plate 310 may be changed. The side holder 350 may include the insulating material of the plate 310 described above, so as not to affect the electromagnetic waves. In one exemplary embodiment, the side holder 350 may include the rubber or the reinforced plastic of the plate 310.

The side holder 350 may include an automatic angle controller (not shown) automatically controlling the angle of the plate 310.

An embodiment of an inspection system for a display panel employing the inspection jig 300 of FIG. 7, is substantially the same as the inspection system for the display panel in FIG. 4, except for the guide part 313 of the inspection jig 300. Thus, the same reference numerals will be used to refer to the same or like parts as those described for FIGS. 1-4, and any further repetitive explanation concerning the above elements will be omitted.

The inspection jig 300 may be set and maintained at the predetermined angle by the side holder 350 controlling the angle of the plate 310. In the illustrated embodiment, the display panel 30 received by the ground plate 330 is received between portions of the guide part 313, so that deviation of the display panel 30 from the plate 310 in upward, downward and lateral directions may be reduced or effectively prevented, when the angle of the plate 310 with respect to the surface of the earth is no more than about 90°.

Advantageously, when the angle of the display panel 30 to be inspected, with respect to the surface of the earth, is controllable in every inspection process, such as by the angle of the plate 310 receiving the display panel 30 being set and the tightening element of the side holder 350 fixing the control angle, the inspection of the display panel 30 may be safely performed.

A method for inspecting a display panel according to the illustrated exemplary embodiment is substantially the same as the method for inspecting the display panel in FIG. 5 except for the guide part 313 of the inspection jig 300. Thus, the same reference numerals will be used to refer to the same or like parts as those described in FIGS. 1-5, and any further repetitive explanation concerning the above elements will be omitted.

The method for inspecting the display panel according to the illustrated exemplary embodiment is as follows includes installing the display panel 30 to be inspected to the inspection jig 300 (step S100). The ground plate 330, to which the inspected display panel 30 is installed, is arranged between a plurality of the fixing element 311 disposed on the plate 310. One end portion (e.g., a distal end portion) of the guide part 313 which is not fixed to the fixing element 311, is moved to deform the fixing element 313, so that the display panel 30 to be inspected is attached to the inspection jig 300.

Alternatively, after the ground plate 330 is pre-fixed to the fixing element 311 of the plate 310, the distal end portion of the guide part 313 which is not fixed to the fixing element 311 is moved, so that the display panel 30 to be inspected may be inserted into the ground plate 330 pre-fixed to the jig 300.

In the illustrated exemplary embodiment, the angle of a display panel to be inspected may be controlled to be a predetermined angle, and maintained throughout every inspection process. In addition, an inspection jig including side holders and a guide part support and maintain a selected position of a ground plate and the display panel, so that the display panel may be safely inspected. In addition, the ground plate receiving the display panel is disposed between a plate and the display panel, so that additional steps or materials used for attaching an element for grounding in every inspection process may be advantageously omitted.

Figure 8:
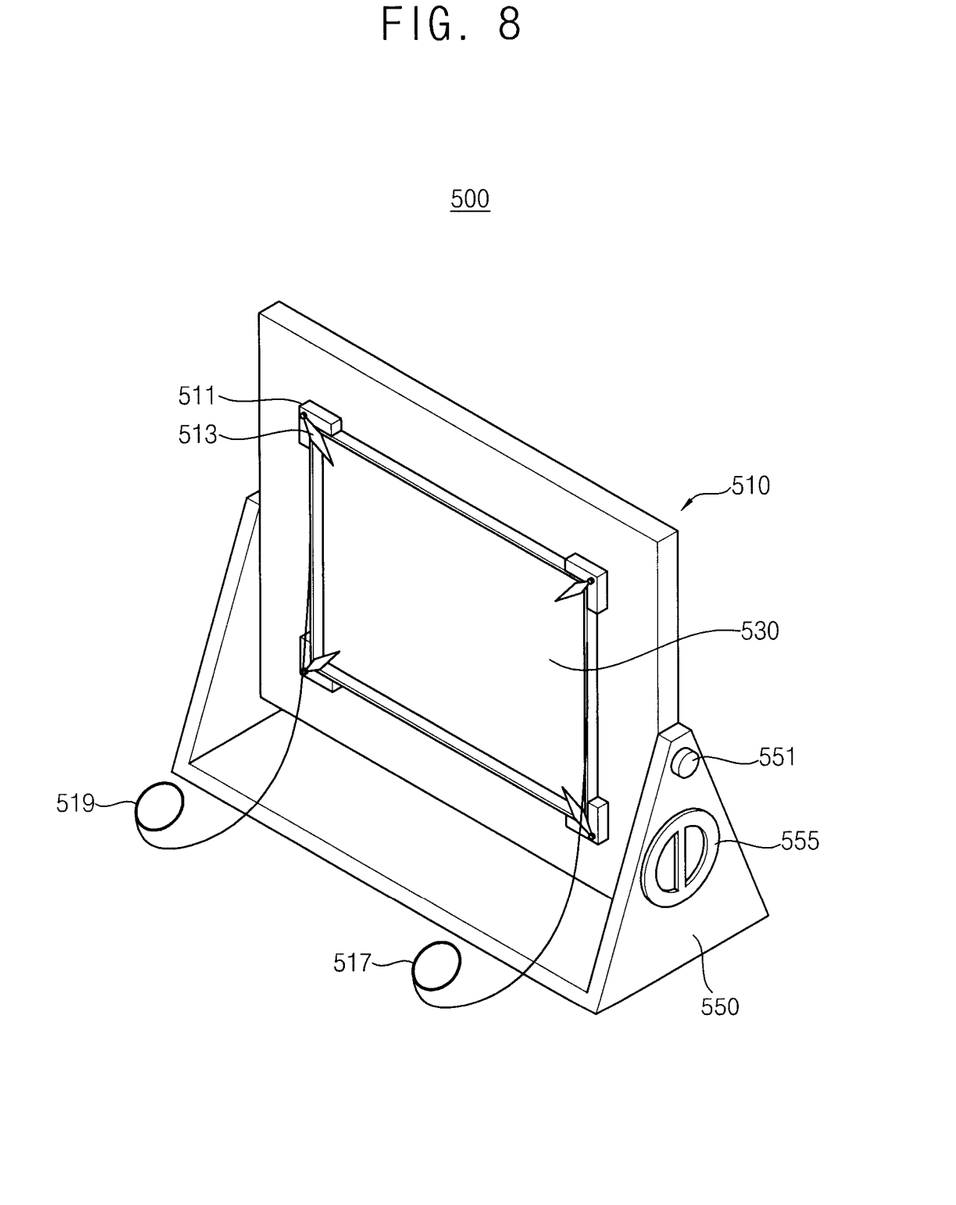
FIG. 8 is a perspective view illustrating another exemplary embodiment of an inspection jig for a display panel according to the present invention.

FIG. 8 is a perspective view illustrating another exemplary embodiment of an inspection jig for a display panel 30 according to the present invention.

Referring to FIG. 8, the inspection jig 500 for the display panel includes a plate 510, a ground plate 530, a side holder 550 and a guide part 513. Any further repetitive explanation concerning FIGS. 1 to 3 and 7 will be omitted.

The plate 510, the ground plate 530, the side holder 550 and the guide part 513 are separable from each other.

Compared to the exemplary embodiment in FIGS. 1 to 3 and 7, a single and continuous side holder 550 in the illustrated exemplary embodiment is extended from a first side surface of the plate 510, to a second side surface of the plate 510. The first and second side surfaces of the plate 510 are opposite to each other with respect to the plate 510.

The side holder 550 supports the plate 510, allows the plate 510 to move about a pivot axis, and fixes the angle of the plate 510 with respect to the surface of the earth using a tightening element. In the illustrated embodiment, the side holder 550 has a substantially triangular shape, but alternatively may have the rectangular shape and so on.

The side holder 550 may further include a protractor 555. The protractor 555 indicates an inclination angle of the plate 510 with respect to the surface of the earth, or of a supporting surface upon which the inspection jig 500 is disposed. The protractor 555 may be disposed at only one of the side holders 550 disposed at opposing side surfaces of the plate 510, or may be disposed at both of the plurality of side holders 550.

The side holder 550 may further include the tightening element. The tightening element is configured such that the side holder 550 is separable from the plate 510. In addition, the angle of the plate 510 with respect to the surface of the ground may be maintained by the tightening element. In one exemplary embodiment, after setting the angle of the plate 510 to be used in every inspection process, the tightening element of the side holder 550 is actuated to fix the angle of the plate 510 during the inspection processes.

The tightening element of the side holder 550 may include a fixing member (e.g., screw) 551 and an opening formed completely through the side holder 550 to correspond to a dimension of the screw 551. An opening corresponding to a location and/or the dimension of the screw 551 of the side holder 550, may be disposed at the side surface of the plate 510. The screw 551 engages with both the opening formed in the side holder 550 and in the plate 510, such that the selected angle of the plate 510 is fixed, and movement of the plate 510 from the selected angle is restricted and effectively prevented. Actuating of the tightening element of the side holder 550 may also release the plate 510 from a fixed position, such that the angle of the plate 510 may be changed.

The side holder 550 may include the insulating material of the plate 510 described above, so as not to affect electromagnetic waves. In one exemplary embodiment, the side holder 550 may include the rubber or the reinforced plastic of the plate 510.

The side holder 550 may include an automatic angle controller (not shown) automatically controlling the angle of the plate 510.

An embodiment of an inspection system for a display panel employing the inspection jig 500 is substantially the same as the inspection system for the display panel in FIG. 4 except for the guide part 513 of the inspection jig 500. Thus, the same reference numerals will be used to refer to the same or like parts as those described for FIGS. 1-4 and any further repetitive explanation concerning the above elements will be omitted.

The angle of the inspection jig 500 may be set and maintained at the predetermined angle by the side holder 550 controlling the angle of the plate 510. In the illustrated embodiment, the display panel 30 received by the ground plate 530 is received between portions of the guide part 513, so that a deviation of the display panel 30 from the plate 310 in upward, downward and lateral direction may be reduced or effectively prevented when the angle of the plate 510 with respect to the surface of the earth is no more than about 90°.

Advantageously, when the angle of the display panel 30 to be inspected, with respect to the surface of the earth is controllable in every inspection process, such as by the angle of the plate 510 receiving the display panel 30 being set and the tightening element of the side holder 550 fixing the angle, the inspection of the display panel 30 may be safely performed.

A method for inspecting a display panel according to the illustrated exemplary embodiment is substantially the same as the method for inspecting the display panel in FIG. 5 except for the guide part 513 of the inspection jig 500. Thus, the same reference numerals will be used to refer to the same or like parts as those described in FIGS. 1-4 and any further repetitive explanation concerning the above elements will be omitted.

The method for inspecting the display panel according to the illustrated exemplary embodiment includes installing the display panel 30 to be inspected to the inspection jig 500 (step S100). The ground plate 530 to which the inspected display panel 30 is installed is arranged between a plurality of the fixing element 511 disposed on the plate 510, and a portion of the guide part 513 is moved, so that the display panel 30 is attached to the inspection jig 500.

Alternatively, after the ground plate 530 is pre-attached to the fixing element 511 of the plate 510, the distal end portion of the guide part 513 which is not fixed to the fixing element 511 is moved, so that the display panel 30 may be inserted into the ground plate 530 pre-attached to the inspection jig 500.

In the illustrated exemplary embodiment, the angle of a display panel to be inspected may be controlled to be a predetermined angle in every inspection process. In addition, an inspection jig including side holders and a guide part support a ground plate and the display panel so that the display panel may be safely inspected. In addition, the ground plate receiving the display panel is disposed between a plate and the display panel, so that additional steps or materials for attaching an element for grounding in every inspection process may be advantageously omitted.

According to the illustrated embodiments, a position of a display panel to be inspected may be controlled to have a predetermined angle in every inspection process, and the controlled angle may be fixed, so that the display panel may be safely inspected.

In addition, a ground plate receiving the display panel may be disposed between a plate and the display panel, so that additional processes or materials for attaching an element for grounding may be advantageously omitted, and economical and time losses may be decreased.

Having described the exemplary embodiments of the present invention and its advantage, it is noted that various changes, substitutions and alterations can be made herein without departing from the spirit and scope of the invention as defined by appended claims.

What is claimed is:

1. An inspection jig for a display panel, the inspection jig comprising:
    a plate;
    a fixing element protruded in a first direction from the plate;
    a ground plate which is disposed on the plate and receives the display panel, the ground plate comprising:
        a bottom plate between the plate and the received display panel, and
        a ground portion comprising side portions each protruded in the first direction from the bottom plate, wherein adjacent side portions are between an inner surface of a same fixing element and outer surfaces of adjacent side surfaces of the received display panel; and
    a side holder disposed at a side surface of the plate, wherein the side holder controls an angle of the plate.

2. The inspection jig of claim 1, wherein the ground plate further comprises a first ground screw electrically connected to a main antenna of an external driving unit.

3. The inspection jig of claim 2, wherein the ground plate further comprises a second ground screw electrically connected to a sub-antenna of the external driving unit.

4. The inspection jig of claim 1, further comprising a guide part which restricts deviation of the display panel from the ground plate in the first direction and away from the bottom plate of the ground plate.

5. The inspection jig of claim 1, wherein the ground plate and the side holder are separably disposed with the plate.

6. The inspection jig of claim 1, wherein the side holder comprises a tightening element configured to fix the controlled angle of the plate.

7. The inspection jig of claim 6, wherein the side holder further comprises a protractor measuring an inclination angle of the plate with respect to a plane upon which the side holder is disposed.

8. The inspection jig of claim 1, wherein the side holder has a substantially triangular shape.

9. The inspection jig of claim 1, further comprising a top holder having substantially a U-shape, an upper portion of the plate and the ground plate being inserted into an opening portion of the top holder, and the top holder which restricts deviation of the upper portion of the ground plate in the first direction and away from the plate.

10. The inspection jig of claim 9, wherein the top holder comprises a tightening element configured such that the ground plate is separably disposed with the plate.

11. The inspection jig of claim 1, further comprising a bottom holder protruded from the plate and having substantially an L-shape, wherein the bottom holder supports a lower portion of the ground plate and contacts a lower ground side surface of the ground plate.

12. The inspection jig of claim 1, wherein
a side portion of the ground plate protrudes from a side of the bottom plate and supports side surfaces of the display panel.

13. The inspection jig of claim 1, wherein an area of the bottom plate of the ground plate is smaller than an area of the plate.

14. The inspection jig of claim 1, wherein the plate and the side holder comprise reinforced plastic.

15. An inspection system for a display panel, the inspection system comprising:
an inspection jig including:
a plate;
a fixing element protruded in a first direction from the plate,
a ground plate which is disposed on the plate and directly grounded, and receives
a display panel irradiating electromagnetic waves, the ground plate including:
a bottom plate between the received display panel and the plate, and
a ground portion comprising side portions each protruded in the first direction from the bottom plate, wherein adjacent side portions are between an inner surface of a same fixing element and outer surfaces of adjacent side surfaces of the received display panel, and
a side holder disposed at a side surface of the plate to control the angle of the plate;
a driving unit which drives the display panel;
an antenna which receives the electromagnetic waves irradiated by the driven display panel; and
a main body which outputs evaluation data of the driven display panel based on a spectrum of the electromagnetic waves received from the antenna.

16. The inspection system of claim 15, wherein the antenna is spaced apart from the display panel and moves along a direction substantially perpendicular to a plane upon which the side holder is disposed.

17. The inspection system of claim 15, further comprising a spectrum analyzer analyzing the spectrum of the electromagnetic waves received from the antenna.

18. The inspection system of claim 15, further comprising a monitor displaying the evaluation data.

19. A method for inspecting a display panel, the method comprising:
receiving a display panel in a ground plate which is further fixed to a fixing member which protrudes in a first direction from a plate of an inspection jig, such that a bottom plate of the ground plate is between the received display panel and the plate;
controlling an angle of the plate;
driving the display panel to inspect the display panel; and
outputting evaluation data of the inspected display panel, the evaluation data based on electromagnetic waves irradiated by the inspected display panel;
wherein the ground plate of the inspection jig comprises:
the bottom plate between the plate and the display panel, and
a ground portion comprising side portions each protruded in the first direction from the bottom plate, wherein adjacent side portions are between an inner surface of a same fixing element and outer surfaces of adjacent side surfaces of the received display panel.

20. The method of claim 19, further comprising displaying the evaluation data.

21. The method of claim 19, wherein the evaluation data of the inspected display panel is outputted by:
receiving the electromagnetic waves at a position where highest electromagnetic waves are sensed;
analyzing a spectrum of the received electromagnetic waves; and
outputting the evaluation data of the inspected display panel based on the analyzed spectrum.

22. The method of claim 21, further comprising changing a position of an antenna to a direction substantially perpendicular to a plane upon which the side holder is disposed, to find the position where the highest electromagnetic waves are sensed.

23. The method of claim 19, wherein the angle of the plate is controlled by changing the angle of the plate to about 90° with respect to a plane upon which the side holder is disposed during an electromagnetic interference (EMI) inspection.

24. The method of claim 19, wherein the angle of the plate is controlled by changing the angle of the plate to about 110° with respect to a plane upon which the side holder is disposed during a wireless network characteristic inspection.

* * * * *